(12) United States Patent
Feng et al.

(10) Patent No.: US 9,478,942 B2
(45) Date of Patent: Oct. 25, 2016

(54) TRANSISTOR LASER OPTICAL SWITCHING AND MEMORY TECHNIQUES AND DEVICES

(71) Applicant: The Board of Trustees of The University of Illinois, Urbana, IL (US)

(72) Inventors: Milton Feng, Champaign, IL (US); Nick Holonyak, Jr., Urbana, IL (US); Mong-Kai Wu, Champaign, IL (US)

(73) Assignee: The Board of Trustees of The University of Illinois, Urbana, IL (US)

( * ) Notice: Subject to any disclaimer, the term of this patent is extended or adjusted under 35 U.S.C. 154(b) by 0 days.

(21) Appl. No.: 14/545,587

(22) Filed: May 26, 2015

(65) Prior Publication Data
US 2016/0020579 A1    Jan. 21, 2016

Related U.S. Application Data (63) Continuation of application No. PCT/US2013/073414, filed on Dec. 5, 2013.

(60) Provisional application No. 61/797,427, filed on Dec. 6, 2012.

(51) Int. Cl.
| | | |
|---|---|---|
| *G11C 11/34* | (2006.01) | |
| *H01S 5/062* | (2006.01) | |
| *H01S 5/10* | (2006.01) | |

(Continued)

(52) U.S. Cl.
CPC ........ *H01S 5/06203* (2013.01); *G11C 7/005* (2013.01); *G11C 7/10* (2013.01); *G11C 11/42* (2013.01); *G11C 13/04* (2013.01); *H01L 29/0692* (2013.01); *H01L 29/0804* (2013.01); *H01L 29/0817* (2013.01); *H01L 29/0821* (2013.01); *H01L 29/41708* (2013.01); *H01L 29/7371* (2013.01); *H01L 33/0016* (2013.01);

(Continued)

(58) Field of Classification Search
CPC ....................................................... G11C 11/34
USPC ......................................................... 365/114
See application file for complete search history.

(56) References Cited

U.S. PATENT DOCUMENTS

| | | | | |
|---|---|---|---|---|
| 5,499,206 A | * | 3/1996 | Muto | ..................... B82Y 20/00 257/E31.033 |
| 6,005,791 A | * | 12/1999 | Gudesen | ................ B82Y 10/00 365/114 |

(Continued)

OTHER PUBLICATIONS

M. Feng, N. Holonyak, Jr., G. Walter, and R. Chan, "Room Temperature Continuous Wave Operation Of A Heterojunction Bipolar Transistor Laser", Appl. Phys. Lett. 87, 131103 (2005).

(Continued)

*Primary Examiner* — Harry W Byrne (57) ABSTRACT

A ring cavity light-emitting transistor device, including: a planar semiconductor structure of a semiconductor base layer of a first conductivity type between semiconductor collector and emitter layers of a second conductivity type; base, collector, and emitter metalizations respectively coupled with the base layer, said collector layer, and said emitter layer, the base metalization including at least one annular ring coupled with a surface of the base layer; and an annular ring-shaped optical resonator in a region of the semiconductor structure generally including the interface of the base and emitter regions; whereby application of electrical signals with respect to the base, collector, and emitter metalizations causes light emission in the base layer that propagates in the ring-shaped optical resonator cavity.

21 Claims, 10 Drawing Sheets

(51) Int. Cl.
   *H01S 5/34* (2006.01)
   *G11C 13/04* (2006.01)
   *G11C 7/10* (2006.01)
   *H01L 29/08* (2006.01)
   *H01L 29/417* (2006.01)
   *H01L 29/737* (2006.01)
   *H01L 29/06* (2006.01)
   *H01L 33/00* (2010.01)
   *G11C 7/00* (2006.01)
   *G11C 11/42* (2006.01)
   *H01L 33/10* (2010.01)

(52) U.S. Cl.
   CPC ............. *H01S 5/1071* (2013.01); *H01S 5/34* (2013.01); *H01L 33/105* (2013.01)

(56) References Cited

U.S. PATENT DOCUMENTS

| | | | |
|---|---|---|---|
| 7,091,082 B2 | 8/2006 | Feng | 438/235 |
| 7,286,583 B2 | 10/2007 | Feng et al. | 372/30 |
| 7,354,780 B2 | 4/2008 | Feng et al. | 257/292 |
| 7,385,835 B2 * | 6/2008 | Leedy | G03F 7/70658 257/E21.545 |
| 7,535,034 B2 | 5/2009 | Walter et al. | 372/43 |
| 7,693,195 B2 | 4/2010 | Feng et al. | 372/30 |
| 7,696,536 B1 | 4/2010 | Feng et al. | 257/197 |
| 7,711,015 B2 | 5/2010 | Holonyak, Jr. et al. | 372/11 |
| 7,813,396 B2 | 10/2010 | Feng et al. | 372/43.01 |
| 7,888,199 B2 | 2/2011 | Walter et al. | 438/235 |
| 7,888,625 B2 | 2/2011 | Holonyak, Jr. et al. | 250/214 |
| 7,953,133 B2 | 5/2011 | Holonyak, Jr. et al. | 372/43.01 |
| 7,998,807 B2 | 8/2011 | Feng et al. | 438/235 |
| 8,005,124 B2 | 8/2011 | Then et al. | 372/46.011 |
| 8,179,937 B2 | 5/2012 | Walter et al. | 372/38.05 |
| 8,179,939 B2 | 5/2012 | Holonyak, Jr. et al. | 372/43.01 |
| 8,494,375 B2 | 7/2013 | Walter | 398/183 |
| 8,509,274 B2 | 8/2013 | Walter et al. | 372/38.05 |
| 9,140,853 B2 * | 9/2015 | Varghese | G02B 6/12007 |
| 2005/0040432 A1 | 2/2005 | Feng et al. | 257/198 |
| 2005/0054172 A1 | 3/2005 | Feng | 438/313 |
| 2005/0163184 A1 | 7/2005 | Hilliard | 372/67 |
| 2008/0240173 A1 | 10/2008 | Holonyak et al. | 372/9 |
| 2009/0097517 A1 | 4/2009 | Sakamoto et al. | 372/44.01 |
| 2009/0134939 A1 | 5/2009 | Feng et al. | 327/581 |
| 2010/0034228 A1 | 2/2010 | Holonyak et al. | 374/45 |
| 2010/0202483 A1 | 8/2010 | Walter et al. | 372/45.01 |
| 2010/0202484 A1 | 8/2010 | Holonyak, Jr. et al. | 372/45.01 |
| 2010/0272140 A1 | 10/2010 | Walter et al. | 372/38.02 |
| 2010/0289427 A1 | 11/2010 | Walter et al. | 315/219 |
| 2011/0150487 A1 | 6/2011 | Walter | 398/115 |
| 2012/0038960 A1 | 2/2012 | Then et al. | 359/108 |
| 2012/0068151 A1 | 3/2012 | Walter | 257/9 |
| 2015/0098674 A1 * | 4/2015 | Varghese | G02B 6/12007 385/14 |

OTHER PUBLICATIONS

M. Feng, N. Holonyak, Jr. R. Chan, A. James, and G. Walter, "Signal Mixing In A Multiple Input Transistor Laser NearThreshold", Appl. Phys. Lett. 88, 063509 (2006).

R. Chan, M. Feng, N. Holonyak, Jr., A. James, and G. Walter, "Collector Current Map Of Gain And Stimulated Recombination On The Base Quantum Well Transitions Of A Transistor Laser", Appl. Phys. Lett. 88, 143508 (2006).

* cited by examiner

| # | material | x | thickness |
|---|---|---|---|
| 27 | GaAs | 0 | 501 |
| 26 | Al(x)Ga(1-x)As | 0.9-0.12 | 213 |
| 25 | Al(x)Ga(1-x)As | 0.9 | 587 |
| 24 | Al(x)Ga(1-x)As | 0.12-0.9 | 213 |
| 23 | Al(x)Ga(1-x)As | 0.12 | 512 |
| 22 | Al(x)Ga(1-x)As | 0.9-0.12 | 213 |
| 21 | Al(x)Ga(1-x)As | 0.98 | 595 |
| 20 | Al(x)Ga(1-x)As | 0.12-0.9 | 213 |
| 19 | Al(x)Ga(1-x)As | 0.12 | 512 |
| 18 | In(x)Ga(1-x)P | 0.49 | 530 |
| 17 | Al(x)Ga(1-x)As | 0.05 | 110 |
| 16 | GaAs | 0 | 30 |
| 15 | In(x)Ga(1-x)As | 0.2 | 120 |
| 14 | GaAs | 0 | 30 |
| 13 | In(x)Ga(1-x)As | 0.2 | 120 |
| 12 | GaAs | 0 | 30 |
| 11 | GaAs | 0 | 180 |
| 10 | GaAs | 0 | 360 |
| 9 | GaAs | 0 | 180 |
| 8 | GaAs | 0 | 1160 |
| 7 | In(x)Ga(1-x)P | 0.49 | 120 |
| 6 | GaAs | 0 | 540 |
| 5 | Al(x)Ga(1-x)As | | 213 |
| 4 | Al(x)Ga(1-x)As | | 587 |
| 3 | Al(x)Ga(1-x)As | | 213 |
| 2 | Al(x)Ga(1-x)As | | 512 |
| 1 | Al(x)Ga(1-x)As | | 213 |

TRANSISTOR LASER OPTICAL SWITCHING AND MEMORY TECHNIQUES AND DEVICES

PRIORITY CLAIM

This is a continuation of, and priority is claimed from, copending International Patent Application Number PCT/US2013/073414, filed Dec. 5, 2013, which, in turn, claims priority from U.S. Provisional Patent Application No. 61/797,427, filed Dec. 6, 2012, and said International Patent Application and U.S. Provisional Patent Application are incorporated herein by reference.

FIELD OF THE INVENTION

This invention relates to semiconductor light emitting and lasing devices and techniques and, more particularly, to ring light-emitting transistors and transistor lasers, coherent field switching, and optical memory techniques and devices.

BACKGROUND OF THE INVENTION

Included in the background of the present invention are technologies relating to heterojunction bipolar transistors (HBTs, which are electrical tilted charge devices) and light-emitting transistors, transistor lasers, and tilted charge light-emitting diodes (respectively, LETs, TLs, and TCLEDs, all of which are optical tilted charge devices). A tilted charge device gets its name from the energy diagram characteristic in the device's base region, which has, approximately, a descending ramp shape from the emitter interface to the collector (or drain, for a two terminal device) interface. This represents a tilted charge population of carriers that are in dynamic flow—"fast" carriers recombine, and "slow" carriers exit via the collector (or drain).

Regarding optical tilted charge devices and techniques, which typically employ one or more quantum size regions in the device's base region, reference can be made, for example, to U.S. Pat. Nos. 7,091,082, 7,286,583, 7,354,780, 7,535,034, 7,693,195, 7,696,536, 7,711,015, 7,813,396, 7,888,199, 7,888,625, 7,953,133, 7,998,807, 8,005,124, 8,179,937, 8,179,939, 8,494,375, and 8,509,274; U.S. Patent Application Publication Numbers US2005/0040432, US2005/0054172, US2008/0240173, US2009/0134939, US2010/0034228, US2010/0202483, US2010/0202484, US2010/0272140, US2010/0289427, US2011/0150487, and US2012/0068151; and to PCT International Patent Publication Numbers WO/2005/020287 and WO/2006/093883 as well as to the publications referenced in U.S. Patent Application Publication Number US2012/0068151.

An optical tilted charge device includes an active region with built-in free majority carriers of one polarity. At one input to this active region, a single species of minority carriers of opposite polarity are injected and allowed to diffuse across the active region. This active region has features that enable and enhance the conduction of majority carriers and the radiative recombination of minority carriers. On the output side of the region, minority carriers are then collected, drained, depleted or recombined by a separate and faster mechanism. Electrical contacts are coupled to this full-featured region.

Tilted charge light emitters have many important applications in opto-electronics. It is among the objects hereof to devise techniques and devices for light-emitting transistors and transistor lasers that have new and improved characteristics and applications in opto-electronics.

SUMMARY OF THE INVENTION

In accordance with a form of the invention, a ring cavity light-emitting transistor device is set forth, comprising: a planar semiconductor structure of a semiconductor base layer of a first conductivity type between semiconductor collector and emitter layers of a second conductivity type; base, collector, and emitter metalizations respectively coupled with said base layer, said collector layer, and said emitter layer, said base metallization comprising at least one annular ring coupled with a surface of said base layer; and an annular ring-shaped optical resonator in a region of said semiconductor structure generally including the interface of the base and emitter regions; whereby application of electrical signals with respect to said base, collector, and emitter metalizations causes light emission in said base layer that propagates in said ring-shaped optical resonator cavity. An embodiment of this form of the invention further comprises an electrical circuit for controlling application of said electrical signals with respect to said base, collector, and emitter metalizations to operate the device as either a light-emitting transistor or a transistor laser by controlling photon-assisted tunneling. The electrical circuit can comprise an optically controlled switch. In this embodiment, a quantum size region is provided within said semiconductor base layer. The quantum size region can comprise, for example, one or a plurality of quantum wells, quantum dot layers or quantum wire layers. Also in this embodiment, the semiconductor base layer is in the form of an annular mesa on the collector layer and the semiconductor emitter layer is in the form of an annular mesa on the base mesa, and the base and emitter metalizations are respectively deposited on the base and emitter mesas. Upper and lower optically reflective optical confinement regions, in the form of distributed Bragg reflectors, are provided for the ring-shaped optical resonator. Also, oxide confining rings are provided at the inner and outer sidewalls of the emitter mesa.

In accordance with another form of the invention, a method for optical switching, is set forth, including the following steps: providing a semiconductor device that includes a semiconductor base region of a first conductivity type between semiconductor collector and emitter regions of a second conductivity type, providing a quantum size region in said base region, and providing base, collector and emitter terminals respectively coupled with the base, collector, and emitter regions; providing electrical signals with respect to said base, collector, and emitter terminals to obtain light emission from said base region; providing an optical resonant cavity that encloses at least a portion of said base region; increasing the Q of said cavity to obtain substantially vertical collector-emitter voltage behavior as a function of collector current at a given base current; and switching between coherent and incoherent light emission from said base region by controlling said collector-emitter voltage to control photon-assisted tunneling. This technique can be implemented with edge-emitting and vertical-emitting devices. In a preferred embodiment of this form of the invention, the step of increasing the Q of the cavity comprises providing said optical resonant cavity as a continuous closed loop waveguide, such as a ring cavity.

In accordance with a further form of the invention, method is set forth for receiving an optical input signal and producing a switchable coherent optical output that depends on the optical input signal, including the following steps:

providing a semiconductor device that includes a semiconductor base region of a first conductivity type between semiconductor collector and emitter regions of a second conductivity type, providing a quantum size region in the base region, and providing base, collector and emitter terminals respectively coupled with the base, collector, and emitter regions; providing electrical signals with respect to the base, collector, and emitter terminals to obtain light emission from the base region; providing an optical resonant cavity that encloses at least a portion of the base region; increasing the Q of said cavity to obtain substantially vertical collector-emitter voltage behavior as a function of collector current at a given base current; and providing an electo-optic circuit that is responsive to said optical input signal to substantially reduce or increase the collector-emitter voltage and switch the optical emission between coherent and incoherent light. In an embodiment of this form of the invention, the step of providing said opto-electronic circuit comprises providing a photodetector responsive to said optical input signal for coupling a reduced voltage to the collector terminal to control photon-assisted tunneling. In this embodiment, the step of increasing the Q of said cavity comprises providing said optical resonant cavity as a ring cavity.

In still another form of the invention, a method is set forth for storing binary optical information, including the following steps: providing a ring cavity light-emitting transistor; operating said ring cavity light-emitting transistor at first and second related operating points of its hysteresis characteristic, said first operating point causing spontaneous light emission from the ring cavity light-emitting transistor, and said second operating point causing laser emission from the ring cavity light-emitting transistor; and writing binary information for storage into the ring cavity light-emitting transistor by controlling selection of said first or said second operating point. In an embodiment of this form of the invention, the step of operating the ring cavity light-emitting transistor at first and second related operating points of its hysteresis characteristic comprises operating, for a particular base current, at a first operating point of a given collector current and a first collector-emitter voltage and a second operating point of the same given collector current and a second collector-emitter voltage. Also in this embodiment, the step of writing binary information comprises applying an optical pulse to an electro-optic circuit that is responsive to said optical pulse for controlling said collector-emitter voltage. This embodiment also includes the step of providing an optical erase signal to a further electro-optic circuit that is responsive to said erase signal to reset the collector-emitter voltage to a particular one of said first or second operating points.

Further features and advantages of the invention will become more readily apparent from the following detailed description when taken in conjunction with the accompanying drawings.

BRIEF DESCRIPTION OF THE DRAWINGS

In order to show in full contrast the change in the TL operational range, the unaltered cleaved-cavity TL I-V characteristics of the earlier device are shown, repeated in the upper panel (A) of FIG. 4 along with double-mirror-enhanced TL characteristics of the lower panel (B) of FIG. 4.

The diagrams of FIGS. 6A and 6B respectively show I-V characteristics and β as a function of base current for a 400 μm edge-emitting transistor laser at −10 degrees C. and at −50 degrees C., which effectively serves to decrease loss and increase optical gain, thereby effectively increasing Q.

DETAILED DESCRIPTION

Figure 1:
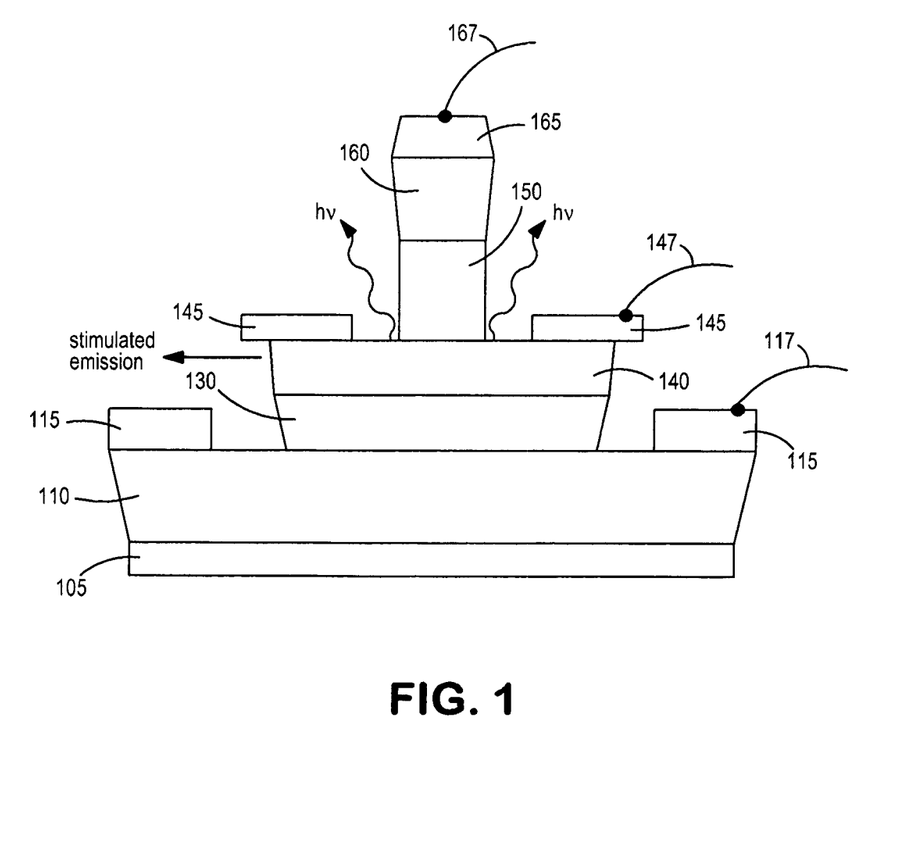
FIG. 1 illustrates, in simplified form, a type of transistor light-emitter device and/or transistor laser device that can be utilized and modified in understanding and in practicing aspects of the invention.

FIG. 1 illustrates, in simplified form, a type of transistor light-emitter device and/or transistor laser device that can be utilized and modified in understanding and in practicing aspects of the invention. A substrate 105 is provided, and the following layers are disposed thereon: subcollector 110, collector 130, base 140, emitter 150, and cap layer 160. The base region typically contains one or more quantum wells (not separately shown). Also shown are collector metalization (or electrode) 115, base metalization 145, and emitter metalization 165. Collector lead 117, base lead 147, and emitter lead 167 are also shown. The layers can be grown, for example, by metal organic chemical vapor deposition (MOCVD). The diagram of FIG. 1 illustrates, with wiggly arrows, light emission hv from the base region when operating as a light-emitting transistor, and also illustrates, with a straight arrow, stimulated emission from the base region (e.g. for an edge emitter with cleaved facets) for operation as a transistor laser. As is known in the art, light-emitting transistors and transistor lasers can also be operated as vertical emitters using, for example, upper and lower distributed Bragg reflectors (DBRs).

An example of a type of transistor laser crystal structure employed in our earlier work and preliminary hereto, can be realized using techniques previously reported (see M. Feng, N. Holonyak, Jr., G. Walter, and R. Chan, Appl. Phys. Lett. 87, 131103 (2005); M. Feng, N. Holonyak, Jr. R. Chan, A. James, and G. Walter, Appl. Phys. Lett. 88. 063509 (2006); and R. Chan, M. Feng, N. Holonyak, Jr., A. James, and G. Walter, Appl. Phys. Lett. 88, 143508 (2006)). For this example, from the substrate upwards, the epitaxial layers of the heterojunction bipolar transistor laser (HBTL) includes a 3000 Angstrom n-type heavily doped GaAs buffer layer, a 634 Angstrom n-type $Al_{0.40}Ga_{0.60}As$ layer, a 5000 Angstrom n-type $Al_{0.95}Ga_{0.05}As$ layer, and a 200 Angstrom n-type $Al_{0.40}Ga_{0.65}As$ layer, followed by a 200 Angstrom n-type collector contact layer, a 120 Angstrom n-type $In_{0.49}Ga_{0.51}P$ etch stop layer, a 600 Angstrom undoped GaAs collector layer, and then a 1010 Angstrom p-type GaAs base layer containing a 190 Angstrom undoped InGaAs quantum well (QW) designed for emission at $\lambda \approx 1000$ nm. On top is a 150 Angstrom n-type $In_{0.49}Ga_{0.51}P$ emitter layer, a 150 Angstrom n-type $Al_{0.35}Ga_{0.65}As$ layer, a 150 Angstrom n-type $Al_{0.80}Ga_{0.20}As$ oxidation buffer layer, and a 4000 Angstrom n-type $Al_{0.95}Ga_{0.05}As$ edge-oxidizable layer (to constrain emitter width), a 300 Angstrom n-type $Al_{0.80}Ga_{0.20}As$ oxidation buffer layer, and a 500 Angstrom n-type $Al_{0.35}Ga_{0.65}As$ layer. The HBLT laser structure is capped with a 1000 Angstrom heavily doped n-type GaAs contact layer.

The crystal processing into TL's can be accomplished basically as described in the above citations using $SIN_4$ and photolithographic masking and patterning, standard wet etching of mesas and contact steps, and the usual contact metallization to effect the various stripe and contact geometries. Stripe emitter widths of 4, 6, and 8 μm on 500 μm centers (for convenient device separation) were used, as well as basic emitter lengths of ~400 μm to allow mirror cleaving at 400 μm multiples. The basic stripe-geometry transistor laser TL, polished to a final thickness of ~75 μm is heat sunk on In-coated Cu heat sinks, contacted with microwave-capable probes, and operated and tested.

Figure 2:
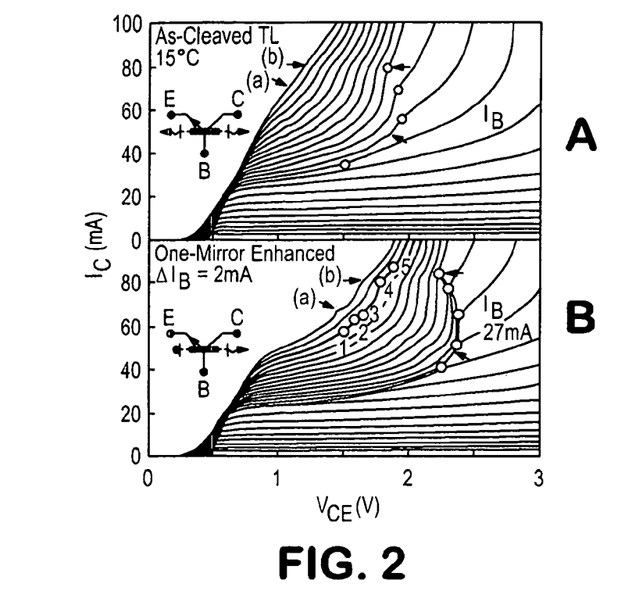
FIG. 2 shows, in its top panel (A) (at 15° C.) the collector I-V characteristics of a transistor laser (TL) of earlier work with a 6 μm emitter mesa (reduced to a 4 μm oxide-defined aperture) and as-cleaved mirror facets (400 μm separation). The region of laser operation is indicated by the shading. The bottom panel (B) is shows the behavior of the same transistor under the same conditions, except with the reflectivity of one facet increased by applying a deformable InGa metal ball at one of the cleaved ends.

The top panel (A) of FIG. 2 shows (at 15° C.) the collector I-V characteristics of a transistor laser (TL) with a 6 μm emitter mesa (reduced to a 4 μm oxide-defined aperture) and as-cleaved mirror facets (400 μm separation). The region of laser operation is indicated by the shading. The bottom panel (B) is shows the behavior of the same transistor under the same conditions, except with the reflectivity of one facet increased by applying a deformable InGa metal ball at one of the cleaved ends. The TL threshold is reduced from 23 to 21 mA and the operational range is extended to higher collector voltage. As explained in APL 88, 232105, supra, the schematic transistor diagrams in the insets are adjusted to show a weaker double-sided optical signal (hv) is obtained from the as-cleaved mirrors of A than from those of B where one of the mirrors is enhanced and the cavity Q is increased. The mirror enhancement prevents an optical signal from being extracted from the altered (blocked) facet but not the other.

Figure 3:
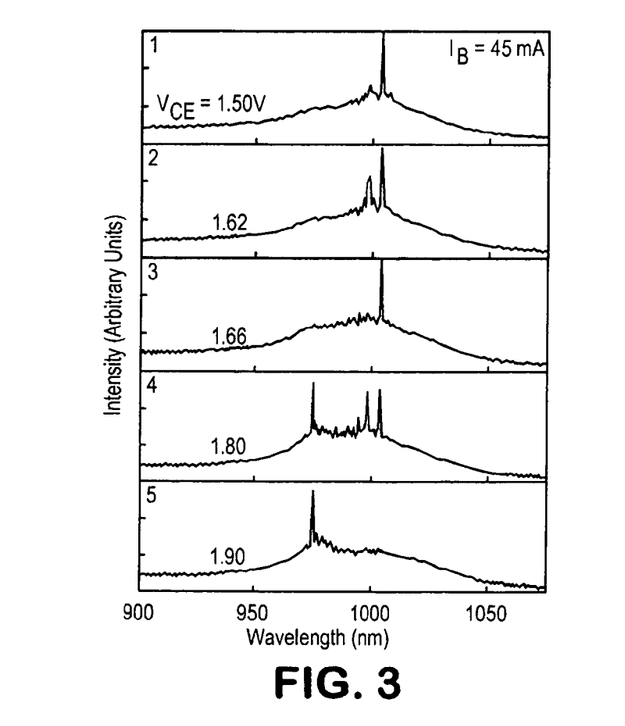
FIG. 3 shows spectra that were taken from the unaltered facet of the device of the earlier work. As described in APL 88, 232105, the panels (1)-(5) are correlated with the bias points marked on the collector I-V curves of FIG. 2B.

Spectra were taken from the unaltered facet and are shown in FIG. 3. As described in APL 88, 232105, supra, the panels (1)-(5) are correlated with the bias points marked on the collector I-V curves of FIG. 2B. At low collector voltages ($V_{CE}$<1.5V) the laser exhibits a 1003 nm single mode operation [FIG. 3, panel (1)]. As the collector voltage is increased from 1.5 V another emission peak at 997 nm is observed [FIG. 3, panel (2)]. The change in emission wavelength can be seen in the I-V curves [FIG. 2B] as a "ridge" running from the arrow denoted (a) as the oppositely directed arrow on the border (the breakdown boundary) of the shaded region. If the voltage is increased further, the 997 nm peak weakens [FIG. 3, panel (3)] and a local minimum ($V_{ce}$=1.66 V) is observed in the collector current. The transistor laser continues to operate at 1003 nm as the collector voltage is increased to $V_{CE}$=1.80 V, where the device shifts operation to include the second level. (See APL 88, 143508, supra.). Multimode operation occurs at 974, 997, and 1003 nm, as shown in FIG. 3, panel (4) [labeled (b) in Figure in FIG. 2B]. The further increase of collector voltage causes finally a single mode operation at 974 nm, as shown in FIG. 3, panel (5). Ridges and ripples in the collector I-V curves are characteristic of all of the changes in the operation of the transistor laser, which is in accord with the fact that the base transport properties of a transistor are sensitive to change in carrier recombination processes and lifetimes.

Figure 4:
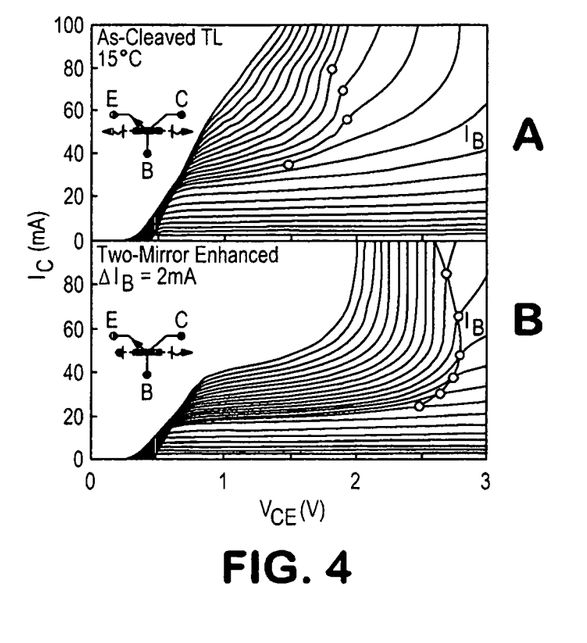

As further described in APL 88, 232105, further enhancement of the cavity Q by increasing the second mirror reflecting (second deformable InGa ball) leads to further threshold reduction and further extension of the TL operational range, but it blocks the optical signal, making it necessary to use the data of FIGS. 1 and 2 to interpret the data of FIG. 3. To show in full contrast the change in the TL operational range, the unaltered cleaved-cavity TL I-V characteristics are shown, repeated in FIG. 4A along with the double-mirror-enhanced TL characteristics of FIG. 4B. The threshold current is reduced from $1_B$=23 to 19 mA and the TL voltage range is significantly extended ($\leq$2.5 V). It is the reduced narrow-line signal level at reduced threshold (higher Q, lower current operation) that permits higher bias voltage (increased voltage range) before the bias and direct-gap photon-assisted tunneling (Franz-Keldysh effect) cause breakdown $\alpha \rightarrow 1$ (constrained by $I_E+I_B+I_C=0$).

Figure 5:
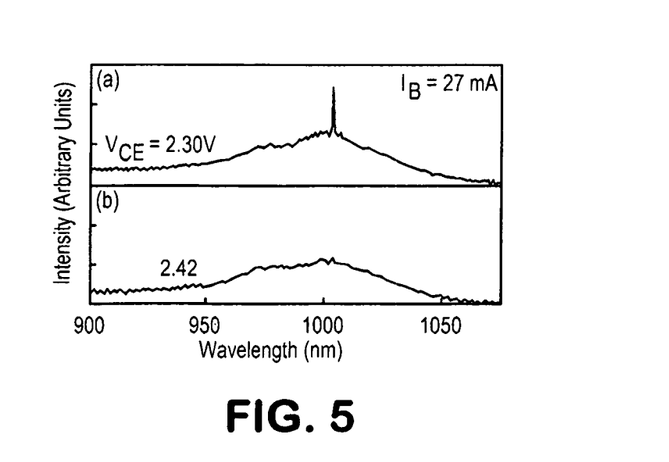
FIG. 5 shows behavior of the earlier device as TL switches from stimulated to spontaneous recombination, from high coherent optical field to lower incoherent "signal" (that is, to broad spontaneous recombination radiation), lower effective field, and smaller slope of the breakdown curve.

The TL threshold boundary along the lower and right edge of the shaded region of FIG. 3(b) is seen to follow and be relatively smooth along the current $I_B=I_{thres}$=const to ~2.5 V and then turn upward, crossing $I_B=I_{thres}$ at slope-change "breakdown" corners at progressively higher $I_B$ values. At these corners the TL switches from stimulated to spontaneous recombination, from high coherent optical field to lower incoherent "signal" (that is, to broad spontaneous recombination radiation), lower effective field, and smaller slope of the breakdown curve. This behavior is illustrated in FIG. 5, with the TL biased at the relatively high current $I_B$=27 mA. The high-field mode (1003 (nm) at 2.3 V switches off at slightly higher bias (2.42 V), thus reducing the photon-assisted tunneling. This behavior (slope-change "corners") occurs along the entire boundary, a consequence of high-field photon-assisted tunneling and its collapse as $\alpha \rightarrow 1$ (constrained by $I_E+I_B+I_C=0$), which in common with other breakdown mechanisms (e.g. avalanche in Si), is well known to cause transistor switching, (see J. L. Mill, M. Tanenbaum, J. M. Goldey, and N. Holonyak, Proc. IRE 44 1174 (1956)). As observed in APL 88, 232105, supra, the simplest response of the transistor laser to limit and balance $I_C$ is to shift from stimulated recombination and from stronger photon-assisted tunneling to weaker, spontaneous recombination (from high coherent to low incoherent field).

A further edge emitting transistor laser, with similar layer structure was implemented with effectively increased Q, and exhibited sharp vertical collector current behavior at low temperature that is highly useful for opto-electronic switching.

Figure 6A:
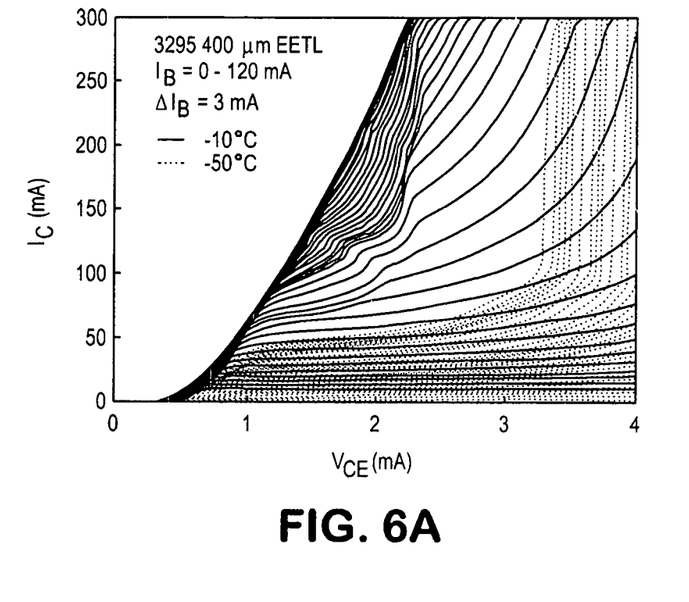
Figure 6B:
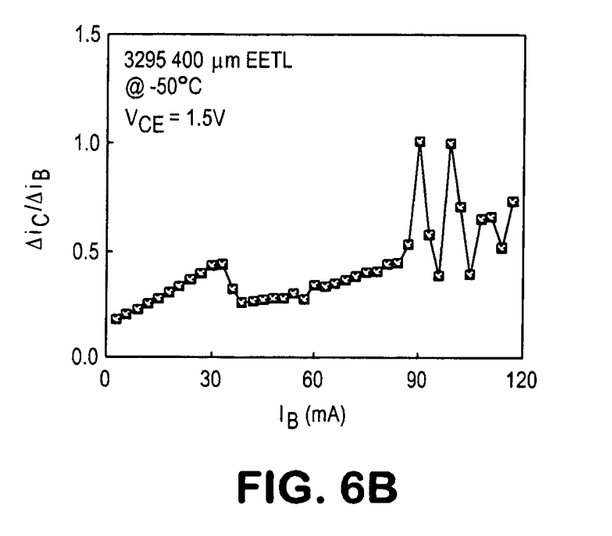

The diagrams of FIGS. 6A and 6B respectively show I-V characteristics and β as a function of base current for the 400 μm edge-emitting transistor laser at −10 degrees C. and at −50 degrees C., which effectively serves to decrease loss and increase optical gain, thereby effectively increasing Q. FIG. 6 shows graphs of collector current $I_C$ as a function of collector-emitter voltage $V_{CE}$ for values of base current $I_B$ in the range 0-120 mA. The solid line curves are for operation at −10 degrees C. with $I_{TH}=I_B=45$ mA, and the dashed line curves are for operation at −50 degrees C. FIG. 6B shows a graph of β (that is, current gain $\Delta I_C/\Delta I_B$) as a function of base current $I_B$ for operation at −50 degrees C. The graph indicates laser threshold $I_{TH}=I_B=32$ mA with a β compression, and also visible in the dashed line curves of FIG. 6A. Thus, at −50 degrees C., there is observed in FIG. 6A a sharp coherent field transistor collector current switching characteristic between $V_{CE}=3$ and 4V. This substantially vertical collector-emitter voltage behavior as a function of collector current at a given base current is related to the high-field photon-assisted tunneling reduced cavity photon density and generated electron and hole pair (e-h) for tunneling base current and tunneling collector current or quenched (the sharp mode) by the constraint $I_E+I_B+I_C=0$ as $\alpha \rightarrow 1$ ($\alpha \equiv -\Delta I_C/\Delta I_E$).

In accordance with an embodiment of the invention, a ring light-emitting transistor and ring transistor laser are set forth. (It will be understood that the reference to a ring designates a continuous loop that is preferably, but not necessarily, circular.) The ring cavity of a transistor laser (or light-emitting transistor) can have substantially less optical loss than conventional mirror-enclosed cavities and therefore can have a substantially higher Q. As a result of this and other attributes, operational advantages accrue, as further described herein.

Figure 7:
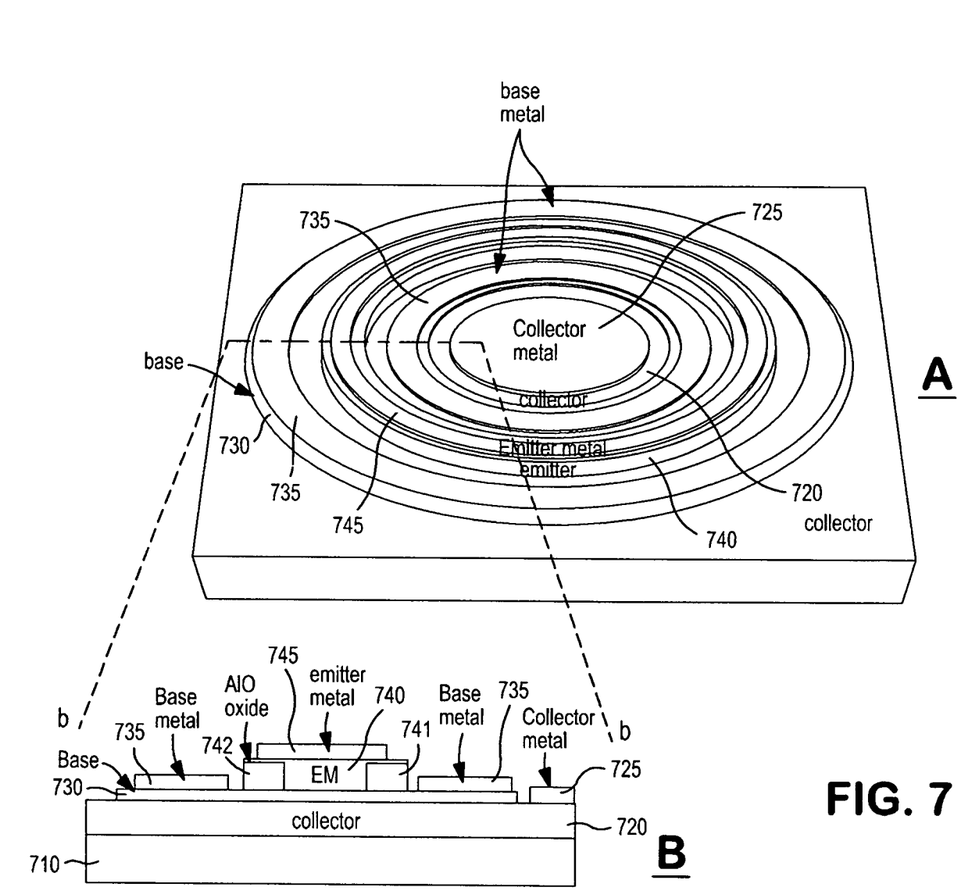
FIG. 7 shows, in the Figure portion A, a perspective view, and in the Figure portion B, a partial cross-sectional view, of a ring cavity light-emitting transistor and ring laser in accordance with an embodiment of the invention, and which can be used in practicing an embodiment of the method of the invention.

Referring to FIG. 7, there is shown, in the Figure portion A, a perspective view, and in the Figure portion B, a partial cross-sectional view, of a ring cavity light-emitting transistor and ring laser in accordance with an embodiment of the invention, and which can be used in practicing an embodiment of the method of the invention. As seen in the Figure, the cross-section is taken through a vertical plane portion defined by the broken-line (alternating dots and dashes) of the trapezoidally shaped line b-b. The transistor device can be operated as a light-emitting transistor or a transistor laser, depending on the electrical signals applied to the terminals thereof.

The simplified layer structure of the FIG. 7 device includes a semiconductor substrate 710, a collector layer 720 of a second conductivity type (preferably, but not necessarily, n-type), a base layer 730 of a first conductivity type (preferably, but not necessarily, p-type), containing a quantum size layer such as one or more quantum wells (not separately shown in FIG. 7), and an emitter layer 740 of said second conductivity type. As can be seen in FIG. 7, the mesa of base layer 730 is formed as an annular ring over the collector layer 720, and the emitter mesa is formed as an annular ring over the base mesa. These, and all, annular rings of the structure are concentric.

Referring further to FIG. 7, in this embodiment the collector metalization 725 is a central disc deposited over the central region of the collector layer 740. [As above indicated, the diagram of FIG. 7 is simplified for ease of explanation. As is typical for semiconductor device technology, electrode coupling to collector and emitter layers is often via respective sub-collector and sub-emitter layers, if appropriate, as will be understood throughout.] Base metalizations 735 and 736 are deposited as concentric annular rings on the base mesa, and have the annular emitter mesa and its annular metalization 745 therebetween and concentric therewith. A III-V oxide, preferably aluminum oxide formed by oxidation of high aluminum content AlGaAs, is formed as inner and outer sidewall confining rings 741 and 742, respectively, on the inner and outer sidewalls of the emitter 740. Collector, base, and emitter terminals are respectively coupled with the collector, base and emitter metalizations (with the base terminal conductor being common to the two base metalizations), and are not separately shown in FIG. 7. An optical output, not separately shown in FIG. 7, can be derived from light scattered from the base region or from a suitable output waveguide coupled with the ring-shaped optical resonator which, in this embodiment, is centered in an annular disc at the base-emitter interface, and advantageously confined by the oxide rings.

Figure 8:
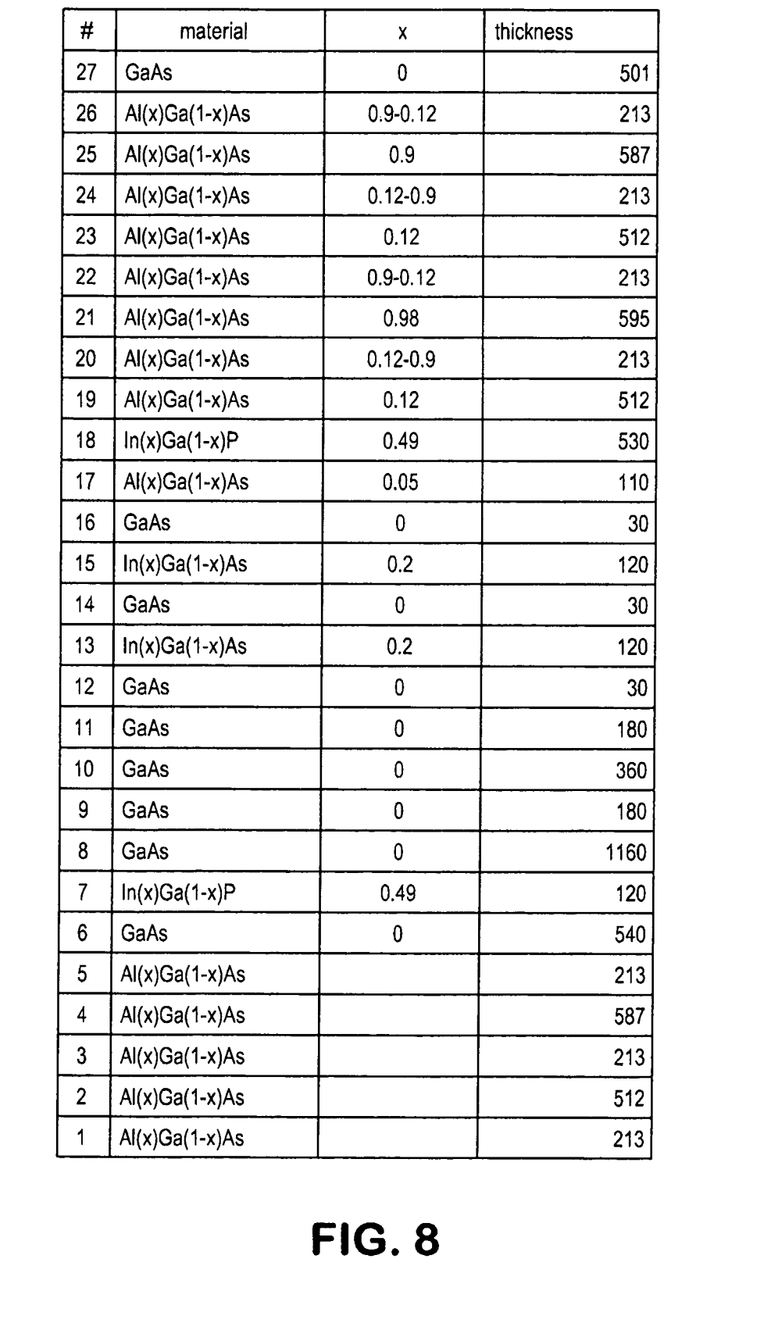
FIG. 8 is a table showing the layer structure for an example of the FIG. 7 embodiment.

The table of FIG. 8 shows the layer structure for an example of this embodiment and includes lower distributed Bragg reflector (DBR) with thirty five pairs of layers (represented in abridged form at layers 1-5) and an upper DBR with four pairs of layers (layers 19-20 and 22-26), thereby providing vertical confinement for the optical cavity. As also seen in the table, the layer structure of this example includes: subcollector layer 6, etch stop layer 7, collector layer 8, base with quantum wells and barrier layers (layers 9-17), emitter layer 18, and aperture layer 21 (for oxidation).

An example of the present embodiment was fabricated with the following representative approximate dimensions: emitter ring width: 5 um, outer diameter of the ring d=50 urn, outer ring length=πd=157 um, oxidation depth: 0.5 um for each side (ring cavity is 4 urn). Base metal to emitter mesa distance is 2 um (both sides).

Figure 9:
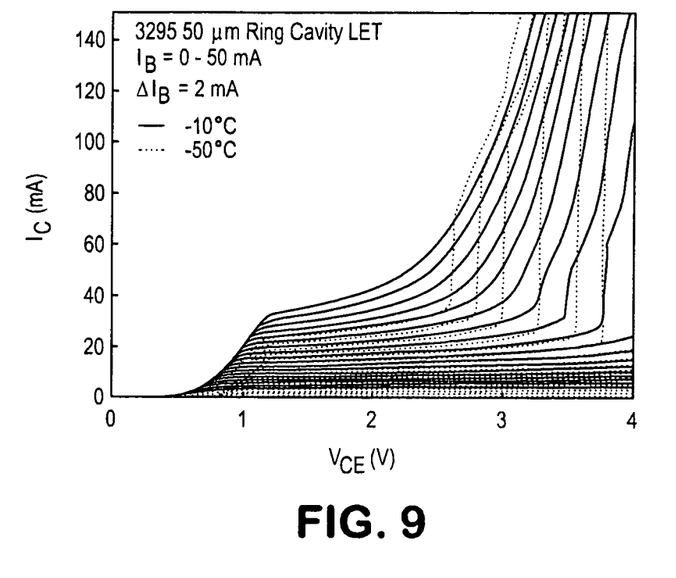
FIG. 9 shows the collector-emitter voltage $V_{CE}$ of the ring cavity light-emitting transistor/transistor laser (LET/TL) of FIG. 7 as a function of collector current $i_C$, for different values of base current, $i_B$, at temperatures of −10 degrees C. and −50 degrees C. The sharp switching characteristic is evident in the lower temperature characteristic.

FIG. 9 shows the collector-emitter voltage $V_{CE}$ of the ring cavity light-emitting transistor/transistor laser (LET/TL) as a function of collector current $i_C$, for different values of base current, 43, at temperatures of −10 degrees C. and −50 degrees C. The sharp switching characteristic is evident in the lower temperature characteristic.

Figure 10:
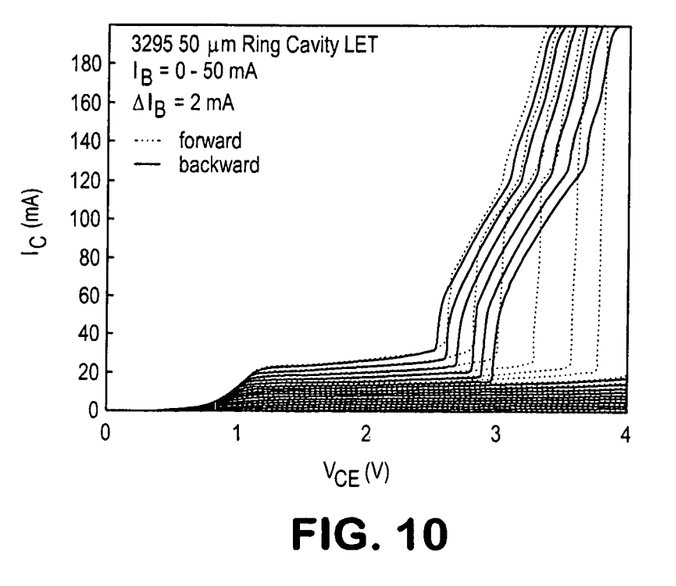
FIG. 10 shows the collector-emitter voltage $V_{CE}$ of the ring cavity LET/TL of FIG. 7 as a function of collector current $i_C$ for different values of base current $i_B$ at −50 degrees C., with the measurements taken forward (increasing $V_{CE}$) and backward (decreasing $V_{CE}$). When the forward $V_{CE}$ is applied, switching is observed from stimulated (coherent) emission to spontaneous (incoherent) emission via intra-cavity photon-assisted tunneling, and in the reverse process, there is switching from spontaneous to stimulated emission via increase in cavity photon density by reduction of electric field. A hysteresis effect is quite evident, and can be utilized for implementation of an opto-electronic memory.

FIG. 10 shows the collector-emitter voltage $V_{CE}$ of the ring cavity LET/TL as a function of collector current is for different values of base current $i_B$ at −50 degrees C., with the measurements taken forward (increasing $V_{CE}$) and backward (decreasing $V_{CE}$). When the forward $V_{CE}$ is applied, switching is observed from stimulated (coherent) emission to spontaneous (incoherent) emission via intra-cavity photon-assisted tunneling, and in the reverse process, there is switching from spontaneous to stimulated emission via increase in cavity photon density by reduction of electric field. A hysteresis effect is quite evident, and can be utilized for implementation of an opto-electronic memory, as will be described further.

Figure 11A:
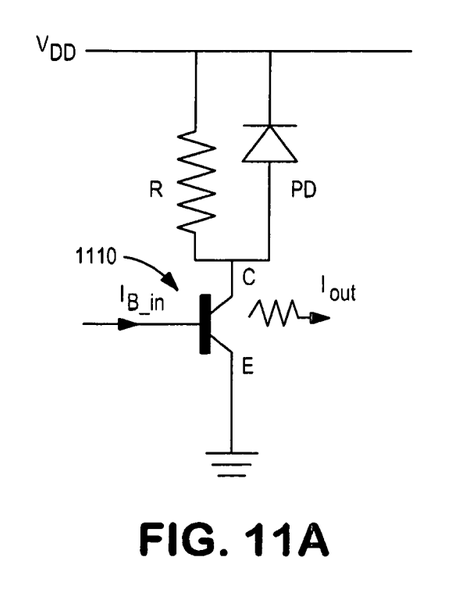
FIGS. 11A and 11B, there show diagrams of the ring cavity device hereof utilized as an optical coherent switch.
Figure 11B:
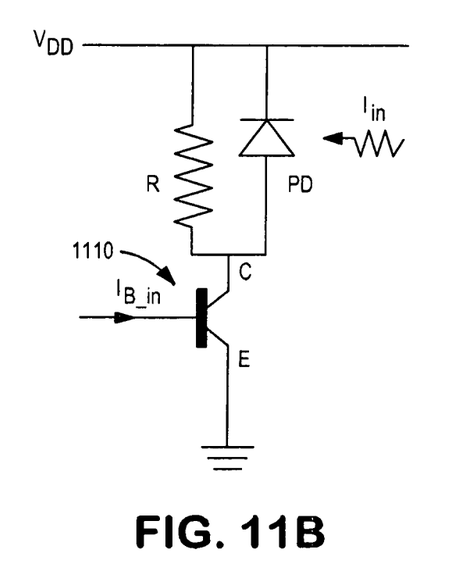

Referring to FIGS. 11A and 11B, there are shown diagrams of the ring cavity device hereof utilized as an optical coherent switch. In this embodiment, the ring cavity light-emitting transistor/transistor laser (LET/TL) device 1110 is shown in a common emitter configuration, with the emitter terminal at common ground potential, and the collector terminal coupled to a bias voltage $V_{DD}$ by a parallel combination of a resistor R and a photodiode PD. The device receives base current $I_{B-in}$. In the diagram of FIG. 11A, no input optical signal is received by the photodetector PD, so the collector voltage is relatively low, and the ring cavity LET/TL operates as a transistor laser (TL) and produces a coherent stimulated emission output designated $I_{out}$. When, however, as in FIG. 11B, the photodiode PD receives the photons of optical input $I_{in}$, the photodiode turns on and the collector voltage becomes relatively high. As a result of this, and the sharp switching characteristic of the ring cavity LET/TL device 1110, the device switches from a coherent optical output to an incoherent output.

Figure 12:
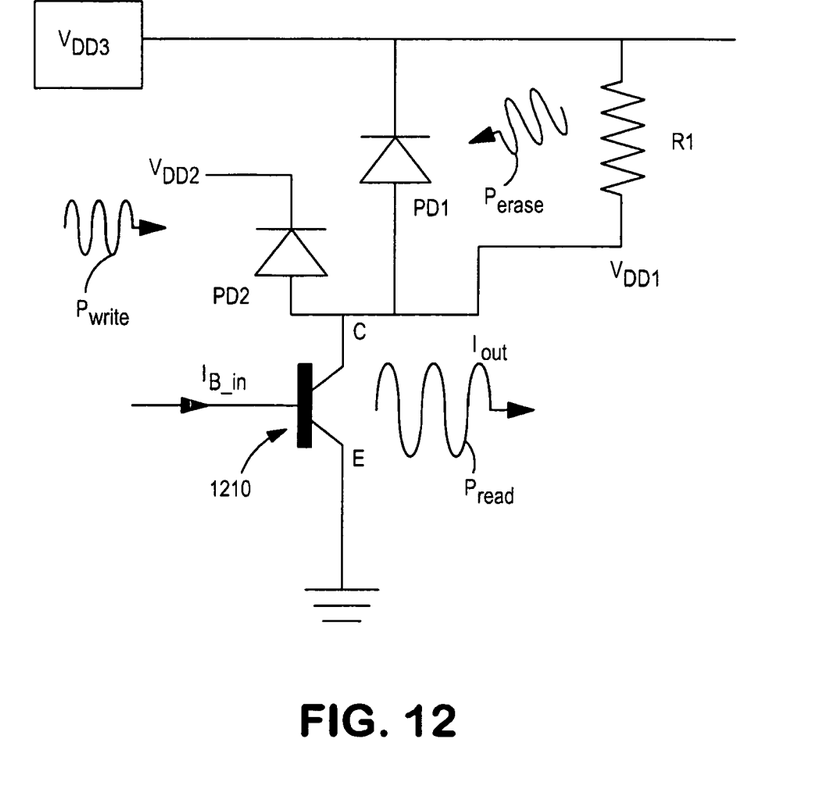
FIG. 12, shows an optical memory circuit that utilizes the hysteresis characteristic of the ring cavity device hereof.

Referring to FIG. 12, there is shown an optical memory circuit that utilizes the hysteresis characteristic of the ring cavity device. The memory element has an optical input and an optical output. In the illustrated embodiment, the ring cavity light-emitting transistor/transistor laser (LET/TL) is represented at 1210, and is shown as operating at a base current, $I_{B-in}$. The collector C of the ring cavity transistor laser is coupled with three parallel branches that determine the collator-emitter voltage $V_{CE}$ in this common emitter arrangement (that is, with the emitter at common ground potential). A bias voltage $V_{DD3}$ is coupled to the collector of the ring cavity transistor laser via resistor R1. The bias voltage $V_{DD3}$ is also coupled to the collector of the ring cavity LET/TL via a photodiode PD1. Also, a bias voltage $V_{DD2}$ is coupled to the collector of the ring cavity LET/TL via a photodetector PD2. The photodetector PD1 receives an optical erase pulse $P_{erase}$, and the photodetector PD2 receives an optical write pulse $P_{write}$. The optical output of the LET/IL is labeled $P_{read}$. Operation of the optical memory of FIG. 12 can be understood with reference to the simplified graphs of FIGS. 13 and 14.

Figure 13:
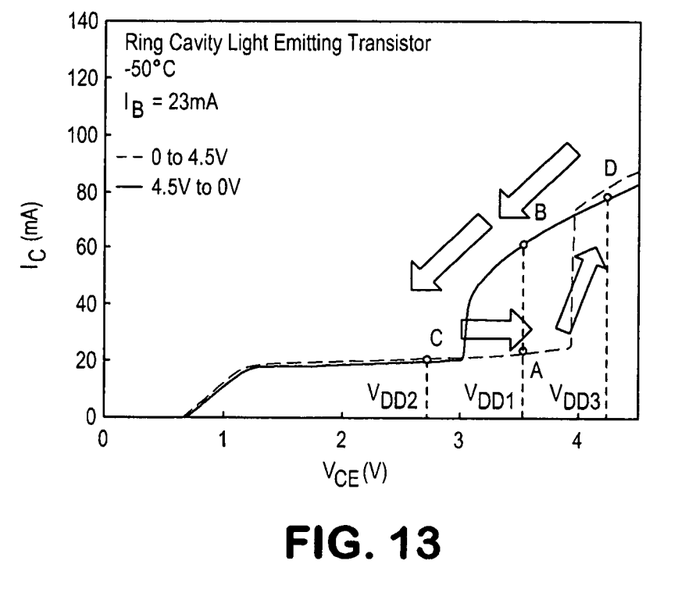
FIGS. 13 and 14 are graphs useful in understanding operation of the FIG. 12 memory circuit.

The graph of FIG. 13 (which is part of the measurement characteristics of the ring LET/TL of FIG. 10) plots collector current $I_C$ as a function of the collector-emitter voltage $V_{CE}$ for a particular base current, $I_B$=23 mA, for the ring cavity LET/TL 1210. The hysteresis characteristic is readily seen in this graph from the substantial difference between the base current at a particular $V_{CE}$ (in the region of $V_{CE}$ between about 3 volts and 4 volts), depending upon whether $V_{CE}$ is in an increasing (forward) part of the characteristic or decreasing (backward) part of the characteristic. The increasing part of the characteristic (see arrows from point C to A and then from point A to D) is shown in lighter gray line, and the decreasing part of the characteristic (see arrows from point D to B and then from point B to C) is shown in black line.

Figure 14:
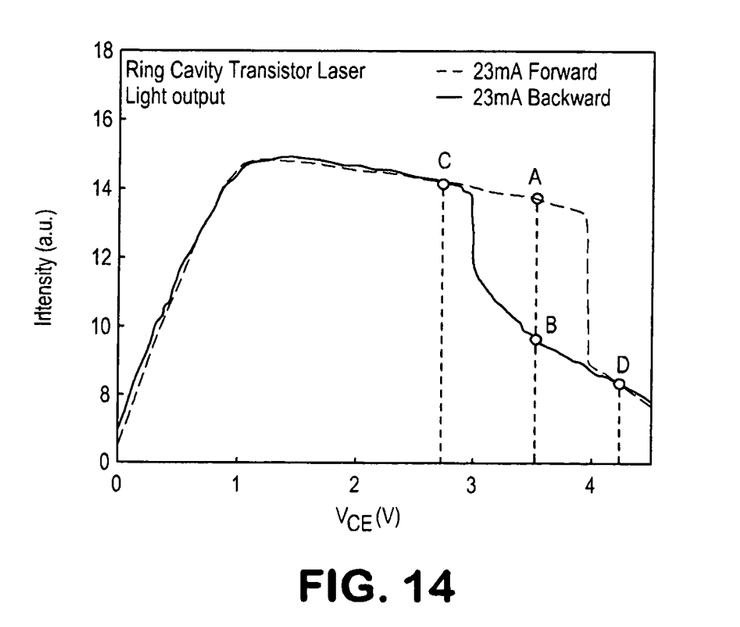

FIG. 14 is a graph showing output light intensity of the ring cavity LET/TL 1210 (in arbitrary units) as a function of collector-emitter voltage $V_{CE}$ at the same particular base current (23 mA). Again in this diagram, the line shading for the "forward" (increasing $V_{CE}$) portion of the characteristic is shown in grey line, and the line shading for the "backward" (decreasing $V_{CE}$) portion is shown in black line. In state C (and state A, coming from C) the ring cavity LET/TL is operating in a stimulated emission (laser) mode which is one of the two possible logical output states. Conversely, when the ring cavity LET/TL is in state B (coming from state D), the optical output is lower intensity spontaneous emission, which is the other of the two logical optical output states.

In normal operation, with the photodetectors PD1 and PD2 non-conductive, the collector voltage is at $V_{DD1}$ and, as seen in FIGS. 13 and 14, the ring cavity LET/TL is either in state A or state B. When an optical erase pulse is received by photodetector PD1, the photodetector will conduct, and the voltage at the collector of the ring cavity LET/TL will be $V_{DD3}$ as seen in the FIG. 13 diagram. This will put the device output in the spontaneous emission logical state (D), regardless of whether it was previously in the state A or the state B. Then, when a "write" optical pulse (e.g. designated "high") is received by photodetector PD2, the photoconductor will conduct, and the voltage at the collector of the device will be $V_{DD2}$, as seen in FIG. 13. This will put the LET/TL device 1210 in the stimulated emission state (state C, as seen in FIG. 14). (If the write optical pulse was "low" the PD2 would not conduct.) Therefore, it is seen that the memory functions, by virtue of the hysteresis characteristic of the LET/TL, to "remember" the state that is read in with the write pulse $P_{write}$, which can be either a first binary logical state represented by a "high" light level that causes PD2 to conduct, or a second binary logical state represented by a "low" light level that does not cause PD2 to conduct. The output $P_{read}$ will thus be indicative of the retained written binary logical state. Ergo, an opto-electronic memory with optical input and optical output.

The invention has been described with reference to particular preferred embodiments, but variations within the spirit and scope of the claimed invention will occur to those skilled in the art. For example, various principles hereof have application to vertical cavity lasers as well as to edge emitting lasers and to disk lasers that function to exhibit mirror gain.

The invention claimed is:

1. A ring cavity light-emitting transistor device, comprising:
    a planar semiconductor structure of a semiconductor base layer of a first conductivity type between semiconductor collector and emitter layers of a second conductivity type;
    base, collector, and emitter metalizations respectively coupled with said base layer, said collector layer, and said emitter layer, said base metalization comprising at least one annular ring coupled with a surface of said base layer; and
    an annular ring-shaped optical resonator in a region of said semiconductor structure generally including the interface of the base and emitter layers;
    whereby application of electrical signals with respect to said base, collector, and emitter metalizations causes light emission in said base layer that propagates in said ring-shaped optical resonator cavity.

2. The device as defined by claim 1, further comprising an electrical circuit for controlling application of said electrical signals with respect to said base, collector, and emitter metalizations to operate said device as either a light-emitting transistor or a transistor laser, by controlling photon-assisted tunneling.

3. The device as defined by claim 2, wherein said electrical circuit comprises an optically controlled switch.

4. The device as defined by claim 2, further comprising a quantum size region within said semiconductor base layer.

5. The device as defined by claim 2, wherein said base metalization comprising at least one annular ring comprises two spaced apart concentric annular rings.

6. The device as defined by claim 2, wherein said emitter metalization comprises an annular ring concentric with said base metalization.

7. The device as defined by claim 6, wherein said collector metalization comprises a central disc concentric with said base metalization.

8. The device as defined by claim 2, wherein said semiconductor base layer is in the form of an annular mesa on said collector layer and said semiconductor emitter layer is in the form of an annular mesa on said base mesa, and wherein said base and emitter metalizations are respectively deposited on said base and emitter mesas.

9. The device as defined by claim 2, further comprising upper and lower optically reflective optical confinement regions for said ring-shaped optical resonator.

10. A method for optical switching, comprising the steps of:
providing a semiconductor device that includes a semiconductor base region of a first conductivity type between semiconductor collector and emitter regions of a second conductivity type, providing a quantum size region in said base region, and providing base, collector and emitter terminals respectively coupled with said base, collector, and emitter regions;
providing electrical signals with respect to said base, collector, and emitter terminals to obtain light emission from said base region;
providing an optical resonant cavity that encloses at least a portion of said base region;
increasing the Q of said cavity to obtain substantially vertical collector-emitter voltage behavior as a function of collector current at a given base current; and
switching between coherent and incoherent light emission from said base region by controlling said collector-emitter voltage to control photon-assisted tunneling.

11. The method as defined by claim 10, wherein said step of increasing the Q of said cavity comprises providing said optical resonant cavity as a continuous closed loop waveguide.

12. A method for receiving an optical input signal and producing a switchable coherent optical output that depends on said optical input signal, comprising the steps of:
providing a semiconductor device that includes a semiconductor base region of a first conductivity type between semiconductor collector and emitter regions of a second conductivity type, providing a quantum size region in said base region, and providing base, collector and emitter terminals respectively coupled with said base, collector, and emitter regions;
providing electrical signals with respect to said base, collector, and emitter terminals to obtain light emission from said base region;
providing an optical resonant cavity that encloses at least a portion of said base region;
increasing the Q of said cavity to obtain substantially vertical collector-emitter voltage behavior as a function of collector current at a given base current; and
providing an electo-optic circuit that is responsive to said optical input signal to substantially reduce or increase the collector-emitter voltage and switch said optical emission between coherent and incoherent light.

13. The method as defined by claim 12, wherein said step of providing said opto-electronic circuit comprises providing a photodetector responsive to said optical input signal for coupling a reduced voltage to said collector terminal to control photon-assisted tunneling.

14. The method as defined by claim 12, wherein said step of providing said semiconductor base region includes providing a quantum size region in said base region.

15. The method as defined by claim 12, wherein said step of increasing the Q of said cavity comprises providing said optical resonant cavity as a ring cavity.

16. A method for storing binary optical information, comprising the steps of:
providing a ring cavity light-emitting transistor;
operating said ring cavity light-emitting transistor at first and second related operating points of its hysteresis characteristic, said first operating point causing spontaneous light emission from said ring cavity light-emitting transistor, and said second operating point causing laser emission from said ring cavity light-emitting transistor; and
writing binary information for storage into said ring cavity light-emitting transistor by controlling selection of said first or said second operating point.

17. The method as defined by claim 16, wherein said step of operating said ring cavity light-emitting transistor at first and second related operating points of its hysteresis characteristic comprises operating, for a particular base current, at a first operating point of a given collector current and a first collector-emitter voltage and a second operating point of the same given collector current and a second collector-emitter voltage.

18. The method as defined by claim 16, wherein said step of providing a ring cavity light-emitting transistor comprises:
providing a planar semiconductor structure of a semiconductor base layer of a first conductivity type between semiconductor collector and emitter layers of a second conductivity type;
providing base, collector, and emitter metalizations respectively coupled with said base layer, said collector layer, and said emitter layer, said base metalization comprising at least one annular ring coupled with a surface of said base layer;
providing an annular ring-shaped optical resonator in a region of said semiconductor structure generally including the interface of the base and emitter layers; and
applying electrical signals with respect to said base, collector, and emitter metalizations causes light emission in said base layer that propagates in said ring-shaped optical resonator cavity.

19. The method as defined by claim 18, further comprising the step of controlling application of said electrical signals with respect to said base, collector, and emitter metalizations to operate said device as either a light-emitting transistor or a transistor laser by controlling photon-assisted tunneling.

20. A method for producing light emission, comprising the steps of:
providing a planar semiconductor structure of a semiconductor base layer of a first conductivity type between semiconductor collector and emitter layers of a second conductivity type;
providing base, collector, and emitter metalizations respectively coupled with said base layer, said collector layer, and said emitter layer, said base metalization comprising at least one annular ring coupled with a surface of said base layer;
providing an annular ring-shaped optical resonator in a region of said semiconductor structure including the interface of the base and emitter layers; and
applying electrical signals with respect to said base, collector, and emitter metalizations to cause light emission in said base layer that propagates in said ring-shaped optical resonator cavity.

21. The method as defined by claim 20, further comprising the steps of controlling application of said electrical signals with respect to said base, collector, and emitter metalizations to operate said device as either a light-emitting transistor or a transistor laser.

\* \* \* \* \*